United States Patent
Pierides et al.

(10) Patent No.: US 9,161,478 B2
(45) Date of Patent: Oct. 13, 2015

(54) APPARATUS AND METHOD FOR AN ACTIVE ANTENNA HEAT SINK

(71) Applicant: FutureWei Technologies, Inc., Plano, TX (US)

(72) Inventors: Alexis Pierides, Piscataway, NJ (US); Minwei Gong, Wilmington, DE (US); Daniel Plaza, Mendham, NJ (US); Shengjun Ou, Bridgewater, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 338 days.

(21) Appl. No.: 13/775,152

(22) Filed: Feb. 23, 2013

(65) Prior Publication Data

US 2013/0223012 A1    Aug. 29, 2013

Related U.S. Application Data

(60) Provisional application No. 61/603,152, filed on Feb. 24, 2012.

(51) Int. Cl.
*H05K 7/20* (2006.01)
*B23P 15/26* (2006.01)
(Continued)

(52) U.S. Cl.
CPC ............ *H05K 7/20409* (2013.01); *B23P 15/26* (2013.01); *F28F 3/02* (2013.01); *Y10T 29/4935* (2015.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467; F28F 3/02; F28F 13/06–13/125
USPC ........................ 361/679.46–679.54, 688–723, 361/676–678; 165/80.1–80.5, 104.33, 185; 174/15.1–15.3, 16.1–16.3, 547–548; 257/712–722, E23.088; 24/453, 24/458–459; 454/184; 312/236
See application file for complete search history.

(56) References Cited

U.S. PATENT DOCUMENTS 7,136,286 B2 * 11/2006 Chuang ......................... 361/703
D568,841 S  *  5/2008 Fischer et al. ............... D13/184
(Continued)

FOREIGN PATENT DOCUMENTS

| CN | 2582172 Y | 10/2003 |
| CN | 101208000 A | 6/2008 |
| WO | 9740569 | 10/1997 |

OTHER PUBLICATIONS

IEEE Standard for Information Technology—Telecommunications and information exchange between systems Local and metropolitan area networks—Specific requirements Part 11: Wireless Lan Medium Access Control (MAC) and Physical Layer (PHY) Specifications, IEEE Std. 802.11, Mar. 29, 2012 (Revision of IEEE Std. 802.11-2007), 2793 pages.

(Continued)

*Primary Examiner* — Anthony Haughton
*Assistant Examiner* — Razmeen Gafur
(74) *Attorney, Agent, or Firm* — Slater & Matsil, L.L.P.

(57) ABSTRACT

Heat dissipation in vertically arrayed host device configurations can be improved through inclusion of heat sinks having split-stream fin architectures. The split-stream fin architecture includes two or more sets of angled fins separated by a central conduit, which allows for more efficient inflow and/or expulsion of convection cooling air over the heat sink. The split-stream fin arrangement may include inwardly angled fins in order to draw convection cooling air inwards from horizontal inlets, in which case warm exhaust is expelled through the central conduit. Conversely, the split-stream fin arrangement may include outwardly angled fins, which draw convection cooling air from the central conduit, and expel warm air through horizontal exhausts. The split-stream fin arrangements function well when host devices are configured horizontally, which allows for more flexible host device configurations.

26 Claims, 18 Drawing Sheets

(51) Int. Cl.
*F28F 3/02* (2006.01)
*H01L 23/473* (2006.01)

(56) References Cited

U.S. PATENT DOCUMENTS

| | | | |
|---|---|---|---|
| 7,535,716 B2 * | 5/2009 | Fischer et al. | 361/714 |
| 7,663,882 B2 * | 2/2010 | Li et al. | 361/697 |
| 2002/0054481 A1 * | 5/2002 | Gustine et al. | 361/704 |
| 2004/0261975 A1 * | 12/2004 | Kozyra et al. | 165/80.3 |
| 2005/0088823 A1 * | 4/2005 | Kabadi et al. | 361/704 |
| 2006/0002087 A1 * | 1/2006 | Bezama et al. | 361/699 |
| 2006/0215357 A1 * | 9/2006 | Green et al. | 361/678 |
| 2007/0151706 A1 * | 7/2007 | Foster et al. | 165/80.3 |
| 2007/0246195 A1 * | 10/2007 | Bhatti et al. | 165/104.33 |
| 2008/0080139 A1 * | 4/2008 | Stanley et al. | 361/702 |
| 2008/0230209 A1 * | 9/2008 | Khalili et al. | 165/104.33 |
| 2008/0236790 A1 * | 10/2008 | Bhatti et al. | 165/80.3 |
| 2009/0073654 A1 * | 3/2009 | Beam et al. | 361/696 |
| 2009/0180251 A1 * | 7/2009 | Biagini et al. | 361/690 |
| 2009/0302458 A1 * | 12/2009 | Kubo et al. | 257/706 |
| 2009/0310310 A1 * | 12/2009 | Anzai | 361/704 |
| 2011/0188205 A1 * | 8/2011 | MacManus et al. | 361/703 |
| 2012/0050993 A1 * | 3/2012 | Suzuki et al. | 361/700 |
| 2012/0063094 A1 * | 3/2012 | Gaynes et al. | 361/707 |
| 2012/0227936 A1 * | 9/2012 | Yang | 165/104.26 |

OTHER PUBLICATIONS

Huawei Technologies, Inc. RRU3201 Description, V1.1, Mar. 31, 2013, 10 pages.

International Search Report and Written Opinion received in International Application No. PCT/CN2013/071847 mailed Jun. 6, 2013, 10 pages.

* cited by examiner

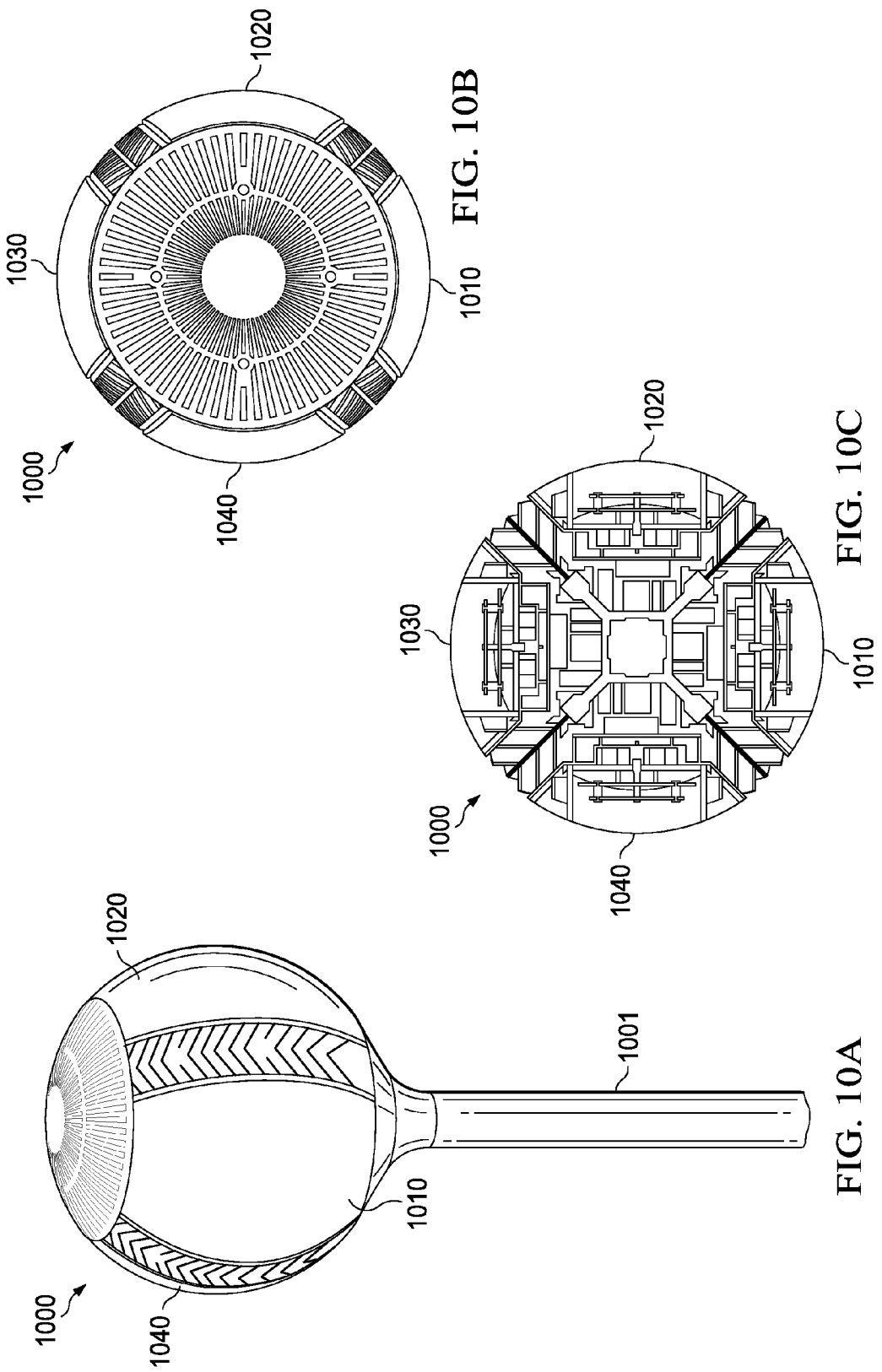

APPARATUS AND METHOD FOR AN ACTIVE ANTENNA HEAT SINK

This application claims the benefit of U.S. Provisional Application No. 61/603,152 filed on Feb. 24, 2012, entitled "Apparatus and Method for an Antenna Heat Sink," which is incorporated herein by reference as if reproduced in its entirety.

TECHNICAL FIELD

The present invention relates to an apparatus and method for thermal cooling, and, in particular embodiments, to an apparatus and method for an antenna heat sink.

BACKGROUND

Modern wireless networks use active antenna systems (AASs) to achieve increased performance on the wireless link. Active antennas are presently used in macro base stations (BSs), and it is foreseeable that active antennas will be deployed as small cell wireless transceivers in the near future. Accordingly, there is potentially significant market demand for compact, modular AAS designs that are cost effective, durable, and capable of being reliably installed and serviced in remote field locations. One challenge in designing compact and durable AASs is that active antennas typically generate significantly more heat than passive antennas due to, inter alia, their inclusion of active antenna components, e.g., power amplifiers, receivers, digital signal processing components, etc. As a result of this increased heat dissipation, active antennas may typically require some means for thermal dissipation, such as a heat sink, heat exchanger or an active cooling system such as fans.

SUMMARY

Technical advantages are generally achieved, by embodiments of this disclosure which describe an apparatus and method for an antenna heat sink.

In accordance with an embodiment, a heat sink for dissipating heat away from a host device is provided. In this example, the heat sink includes a heat dissipating face, a first set of fins extending across the heat dissipating face, a second set of fins extending across the heat dissipating face, and a conduit receding into the heat dissipating face. The first set of fine are angled toward the second set of fins, and the conduit separates the first set of fins from the second set of fins.

In accordance with another embodiment, a radio frequency (RF) module is provided. In this example, the RF module includes active antenna components and a heat sink configured to dissipating heat generated by the active antenna components into the surrounding air. The heat sink includes a heat dissipating face comprising a first set of fins, a second set of fins angled toward the first set of fins, and a conduit receding into the heat dissipating face. The conduit prevents the first set of fins from intersecting with the second set of fins.

In accordance with yet another embodiment, another heat sink is provided. In this example, the heat sink includes a heat dissipating face and a split-stream fin arrangement disposed on the heat dissipating face. The split-stream fin arrangement includes a central conduit receding into the heat dissipating face.

In accordance with yet another embodiment, a method of use is provided. In this example, the method includes generating heat by a host device, and dissipating the heat into the surrounding air by a heat sink affixed to the host device. The heat sink includes a heat dissipating face and a split-stream fin arrangement disposed on the heat dissipating face. The split-stream fin arrangement includes a central conduit receding into the heat dissipating face.

In accordance with yet another embodiment, a method of manufacturing is provided. In this example, the method includes forming a first set of fins along a heat dissipating face of a heat sink, forming a second set of fins along the heat dissipating face of the heat sink, and forming a central conduit along the heat dissipating face of the heat sink. In this example, the central conduit separates the first set of fins from the second set of fins.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 10A-C illustrate diagrams of an embodiment multi-sector RF module cluster;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. While aspects of this disclosure are discussed in the context of passive heat sinks, such aspects may be equally applicable in active heat sink implementations. Further, while heat sinks architectures provided herein are discussed primarily in the context of wireless enabled host devices (e.g., RF modules, etc.), said heat sink architectures may embodied on any host type device (including devices unrelated to wireless communications).

Passive heat sinks dissipate heat entirely through natural convection and without relying on forced air circulation, and therefore tend to be less costly and more reliable than active heat sinks, which rely on electric fans and/or other thermo-electric cooling techniques. Consequently, passive heat sinks are well-suited for modular AAS applications, where power consumption, reliability, and cost are significant design considerations.

Figure 2:
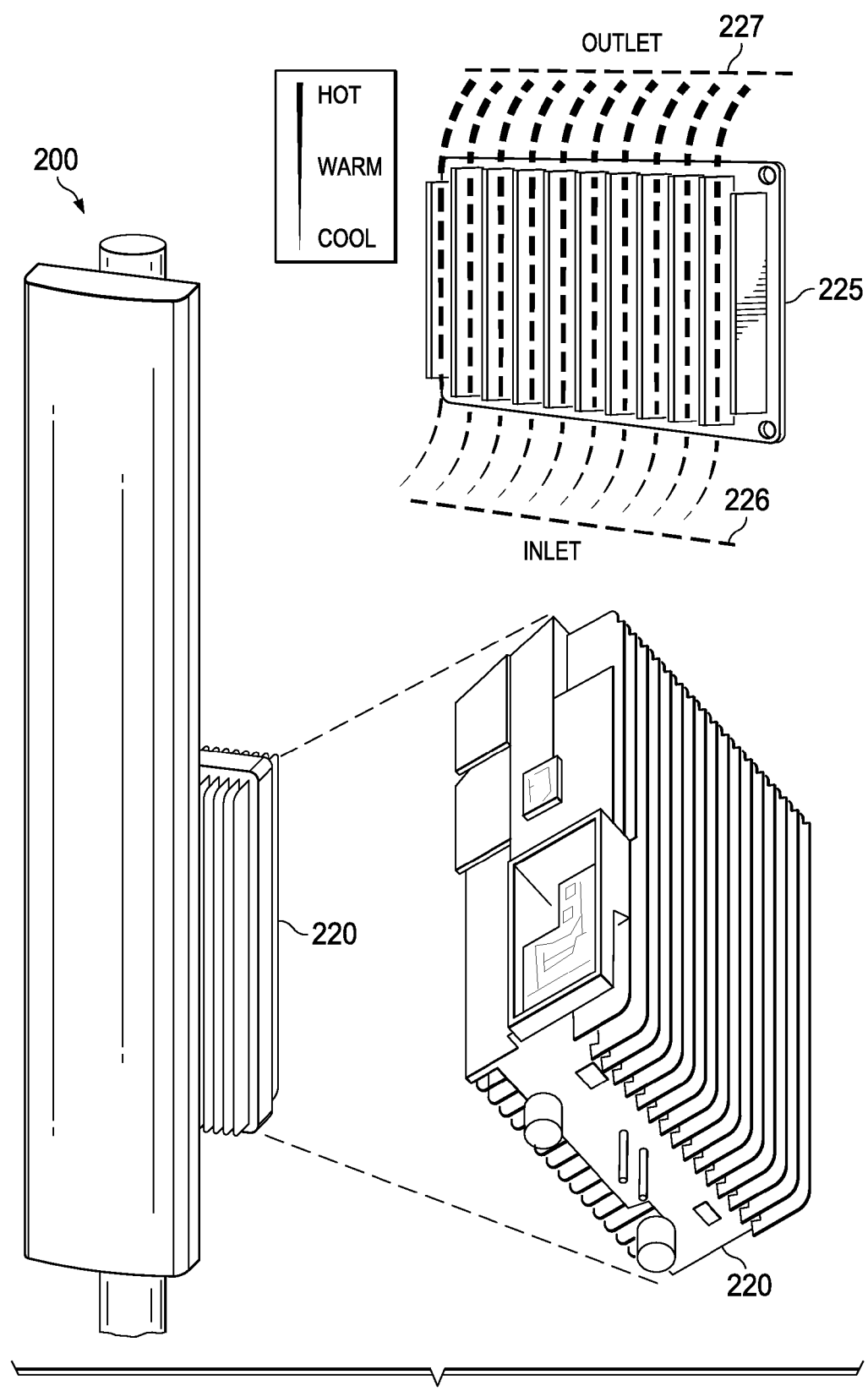
FIG. 2 illustrates a diagram of a prior art heatsink design.
Figure 3:
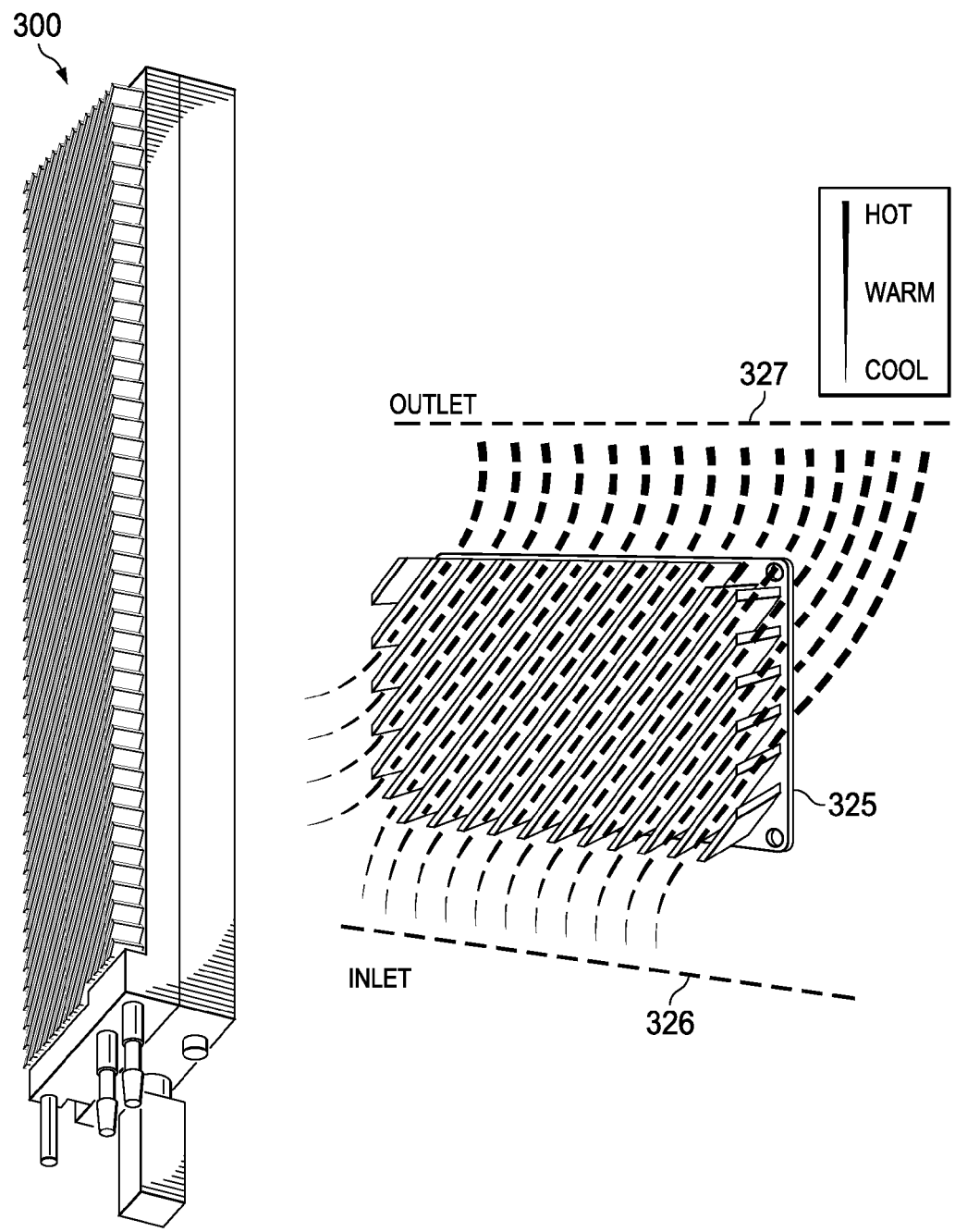
FIG. 3 illustrates a diagram of another prior art heatsink design.
Figure 13:
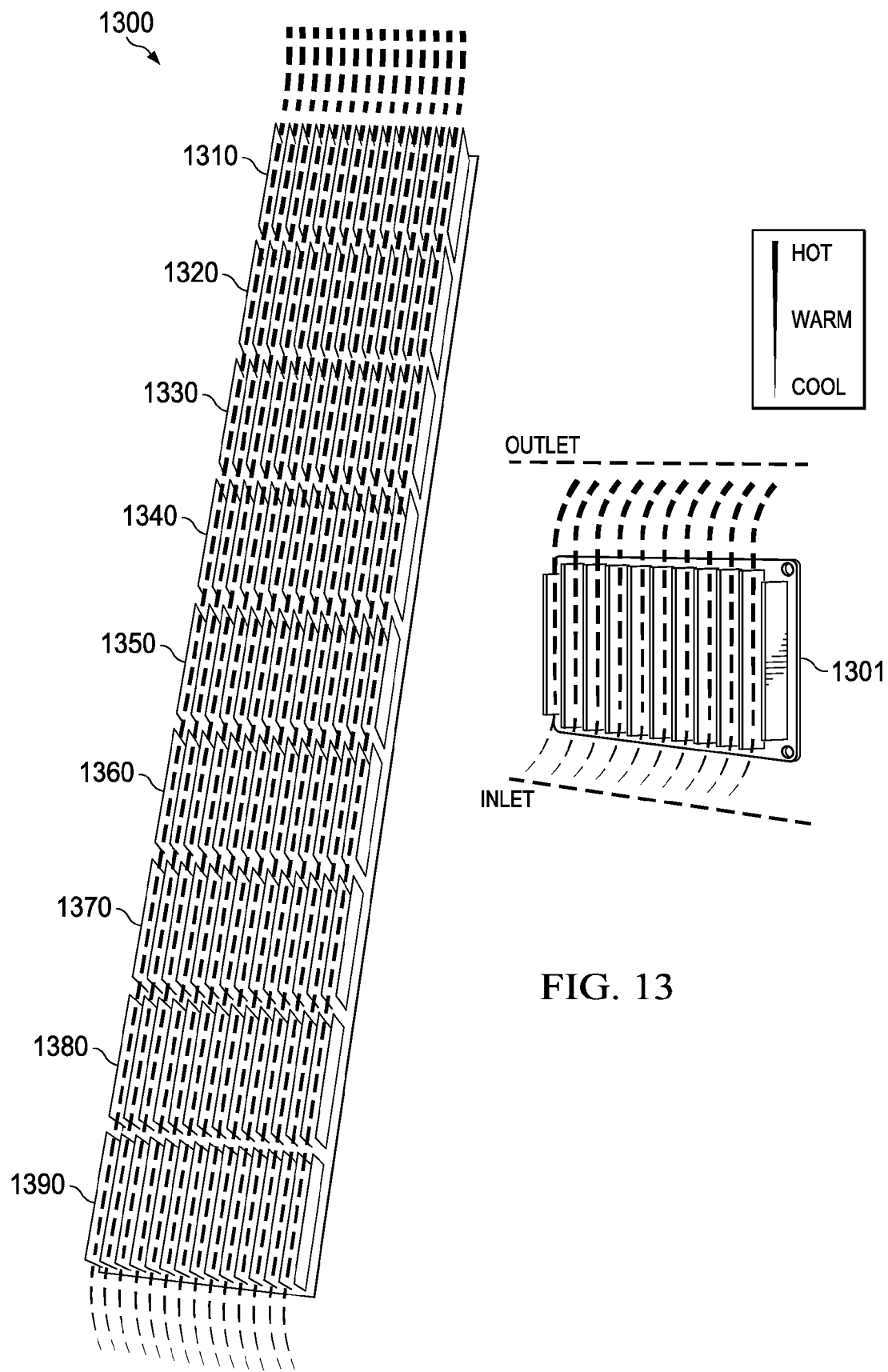
FIG. 13 illustrates a diagram depicting thermal dissipation in a vertically arrayed host device configuration.

Passive heat sinks typically include heat dissipating fins, which act to continuously draw convection cooling air over the surface of the heat sink in accordance with Bernoulli's principal. More specifically, as surrounding air becomes warmer (and therefore less dense), it begins to rise upward through channels created by the fins, thereby creating a pressure vacuum that draws higher density cool air over the surface of the heat sink. In conventional heat sinks, heat dissipating fins run parallel to one another over the length of the heat sink, or at an angle from one side to the other (e.g., as shown in FIGS. 2-3) in order to achieve higher velocity air flows that increase the thermal transfer efficiency of the heat sink. However, strictly parallel fin arrangements are typically less efficient when multiple host devices are arrayed in a vertical fashion, as warm air expelled from lower heat sinks feeds the inlet of higher heat sinks (as seen in FIG. 13), thereby causing comparatively warmer air to flow over host devices positioned higher on the vertical array. Indeed, this problem may be particularly significance in modular AAS configurations, which commonly include vertical RF module arrays for achieving advanced antenna functionality, e.g., beamforming, etc. Accordingly, heat sink architectures that perform efficiently in vertically arrayed configurations are desired.

Aspects of this disclosure provide split-stream fin architectures for implementation in passive heat sinks. The split-stream fin arrangements include two or more sets of angled fins separated by a central channel or conduit, which allows for more efficient inflow and/or expulsion of convection cooling air in vertical RF module arrays. In one example, the split-stream fin arrangement includes inwardly angled fins, which draw cooler high-density air from horizontal inlets, and expel warmer low-density air through a wide central channel. In this example, the expulsion of warm low-density air through the wide central channel creates a "chimney effect," which significantly increases the outlet velocity. In another example, the split-stream fin arrangement includes outwardly angled fins, which draw convection cooling air from the bottom and the rear of the fins, and expel warm air through horizontal through top exhausts. This allows for fresh, cool air to be introduced along the entire height of the combined vertical array heat sink eliminating the aforementioned upward heat cascading effects. Advantageously, the split-stream fin arrangements provided herein function well when host device is configured horizontally (e.g., when the host device is laid on its side), which allows for more flexibility in modular AAS configurations.

Figure 1:
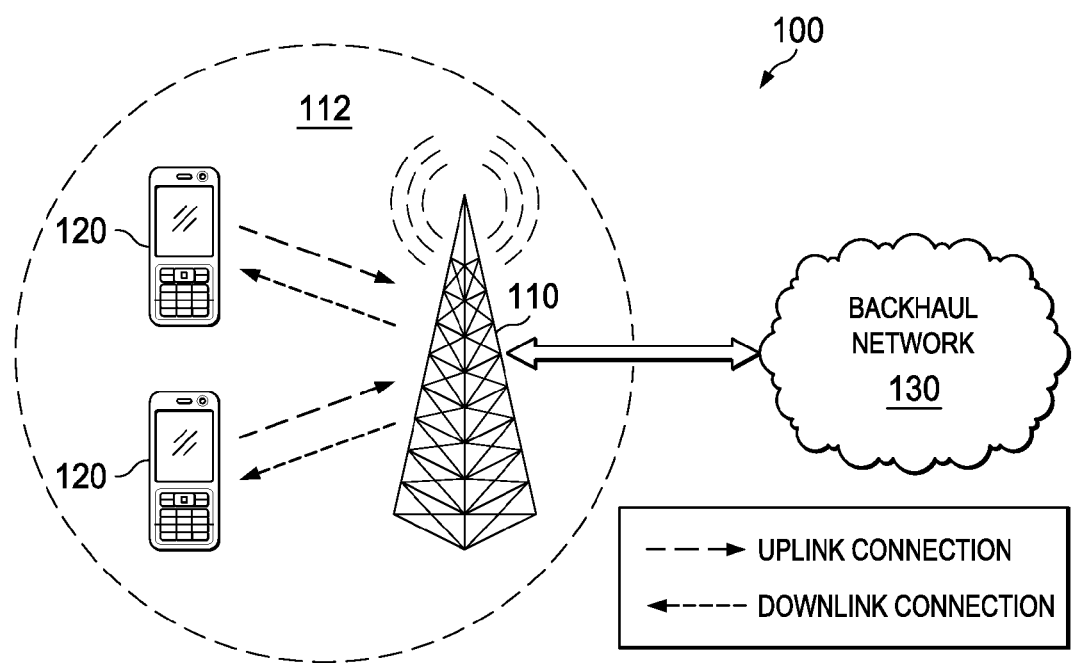
FIG. 1 illustrates a diagram of an embodiment communications network.

FIG. 1 illustrates a network 100 for communicating data. The network 100 comprises an access point (AP) 110 having a coverage area 112, a plurality of user equipments (UEs) 120, and a backhaul network 130. The AP 110 may include a modular AAS that is capable of providing wireless access by, inter alia, establishing uplink (dashed line) and/or downlink (dotted line) connections with the UEs 120. The AP 110 may be a macro base station, an enhanced base station (eNB), a pico base station, a micro base station, a femtocell, or any other device configured to provide wireless access to wirelessly enabled devices. The UEs 120 may comprise any component capable of establishing a wireless connection with the AP 110. The backhaul network 130 may be any component or collection of components that allow data to be exchanged between the AP 110 and a remote end (not shown). In some embodiments, the network 100 may comprise various other wireless devices, such as relays, femtocells, etc.

FIG. 2 illustrates a heat sink 220 of a conventional active antenna 200. As shown, the heat sink comprises straight vertical fins 225, which draw higher-density cool air through the inlet 226, and expel lower-density warm air through the outlet 227. Straight/vertical fins produce high velocity air flows, and therefore provide relatively efficient thermal dissipation in passive heat sinks. Slanted fins offer a conventional alternative to straight/vertical fins. FIG. 3 illustrates a conventional active antenna 300 having an integrated heat sink with slanted fins 325, which draw higher-density cool air through the inlet 326, and expel lower-density warm air through the outlet 327. While slanted fins typically produce slightly lower velocity air flows than straight/vertical fins, the fins are typically shorter, and therefore transfer more heat to a given volume of convection cooling air in some configurations.

Conventional straight or slanted fin arrangements tend to perform well when the distance between the inlet and outlet is relatively short. However, conventional straight fin arrangements are typically less effective in vertically-arrayed host device architectures, as the warm air expelled from lower host devices causes comparatively warmer air to flow over host devices positioned higher on the vertical array. Also, conventional slanted fins are typically twice as long as the split stream fins, and therefore the efficiency over the length of the slanted fins is diminished in comparison.

Figure 4:
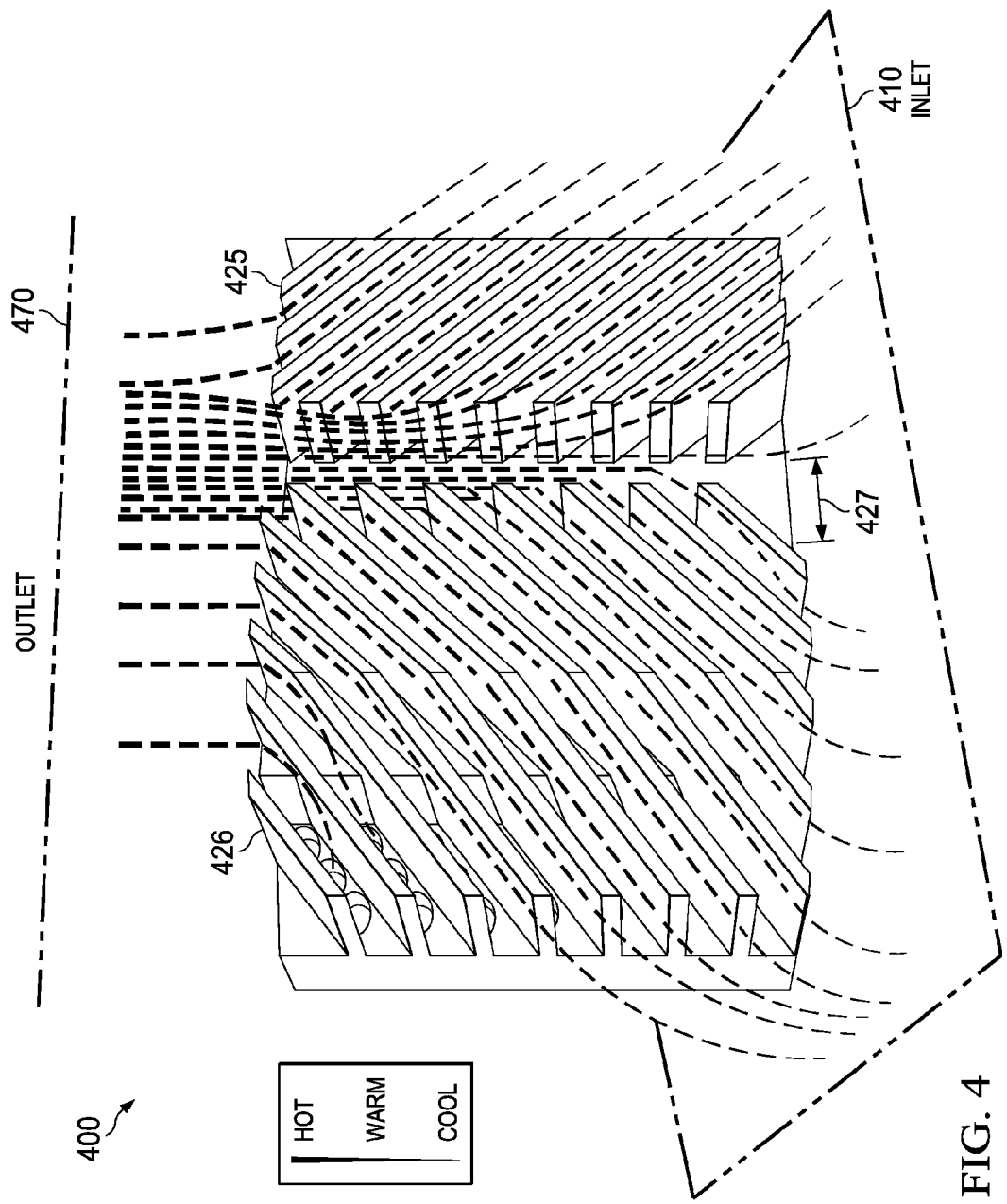
FIG. 4 illustrates a diagram of an embodiment heatsink design.

Aspects of this disclosure provide a split-stream fin arrangement that includes two sets of angled fins separated by a central conduit. FIG. 4 illustrates an embodiment split-stream fin arrangement 400 comprising two sets of inwardly angled fins 425-426 separated by a central conduit 427. As shown, the split-stream fin arrangement 400 draws low density cool air from the inlet 410 as well as horizontally from the sides of the split-stream fin arrangement 400, and exhausts warm air through the outlet 470. Notably, the expulsion of warm low-density air through the wide central channel creates a "chimney effect," which significantly increases the outlet velocity.

Figure 5A:
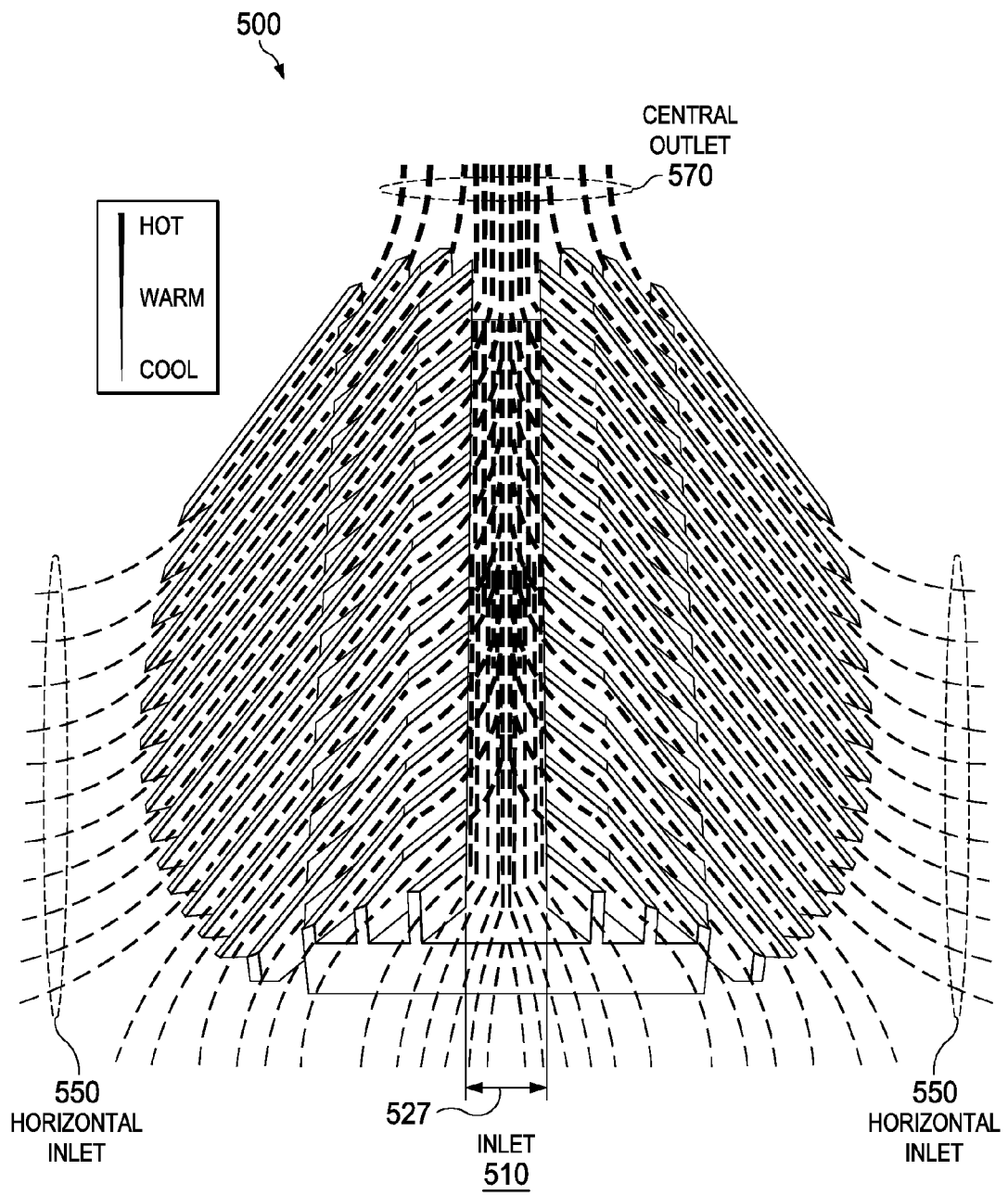
FIGS. 5A-5B illustrate diagrams of an embodiment RF module.
Figure 5B:
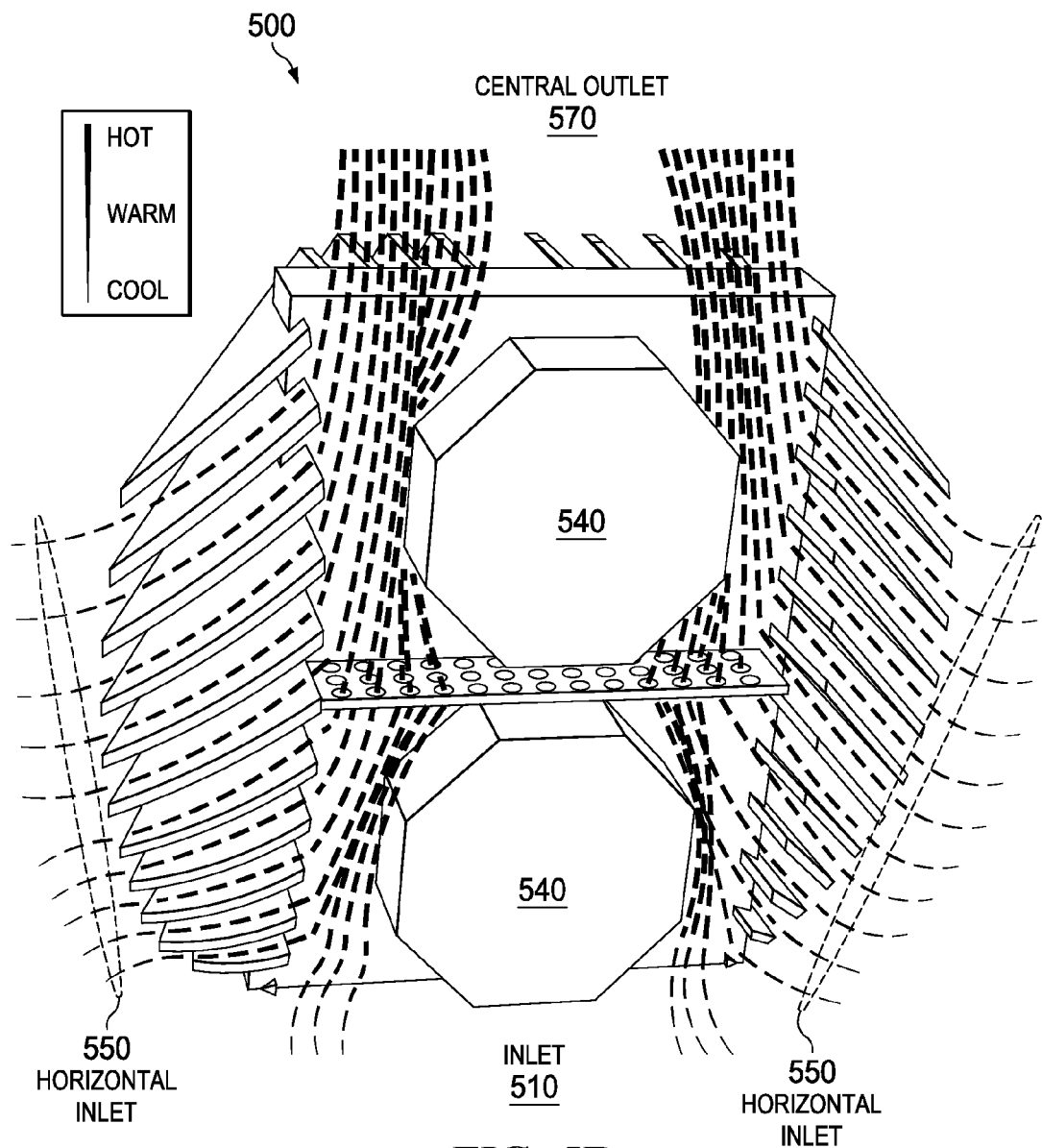

The split-stream fin arrangement 400 may be embodied in wide variety of host devices, including numerous RF module designs. FIGS. 5A-5B illustrate an embodiment RF module 500 that includes a split-stream fin arrangement similar to that depicted in FIG. 4. FIG. 5A illustrates a rear view of the embodiment RF module 500. As shown, the embodiment RF module 500 draws convection cooling air in through the lower inlet 510 as well as through the horizontal inlets 550, and expels warm air through the central outlet 570. Notably, the width of the conduit 527 allows for increased air flow velocity through the central outlet 570. FIG. 5B illustrates a front view of the embodiment RF module 500. As shown, convection cooling air flows around a pair of radomes 540, which encase radiating elements of the embodiment RF module 500.

Figure 6:
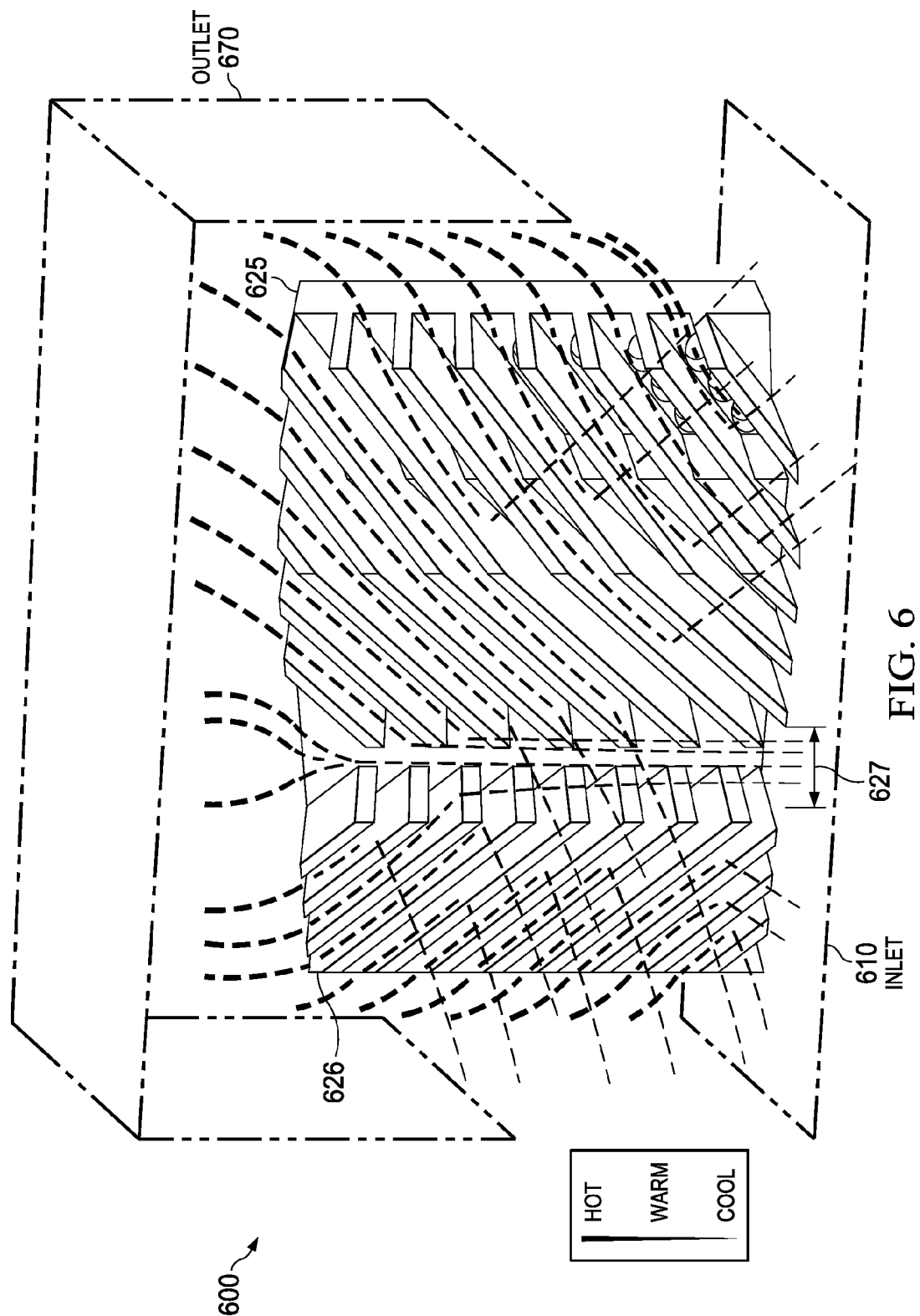
FIG. 6 illustrates a diagram of another embodiment heatsink design.
Figure 7A:
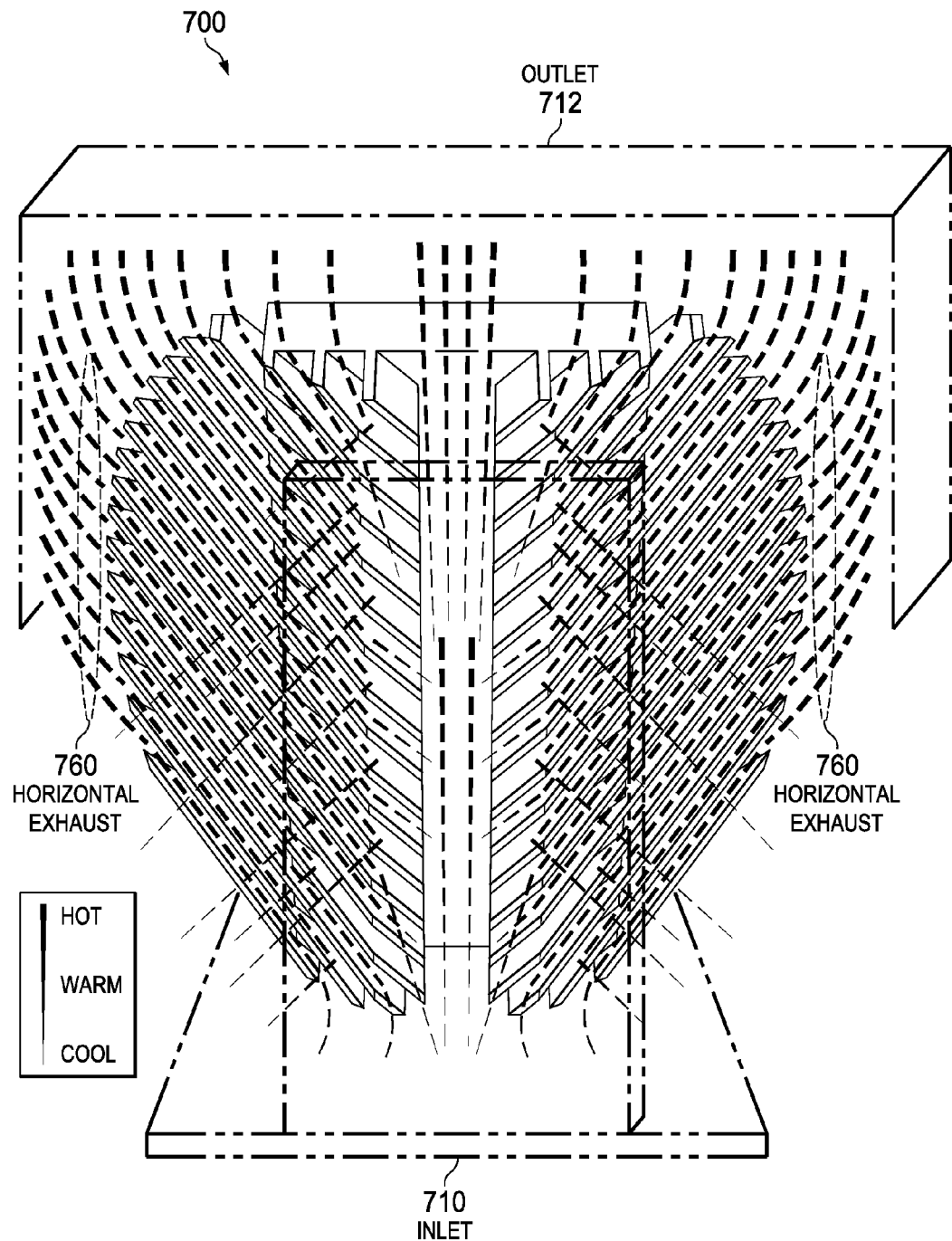
FIGS. 7A-7B illustrate diagrams of another embodiment RF module.
Figure 7B:
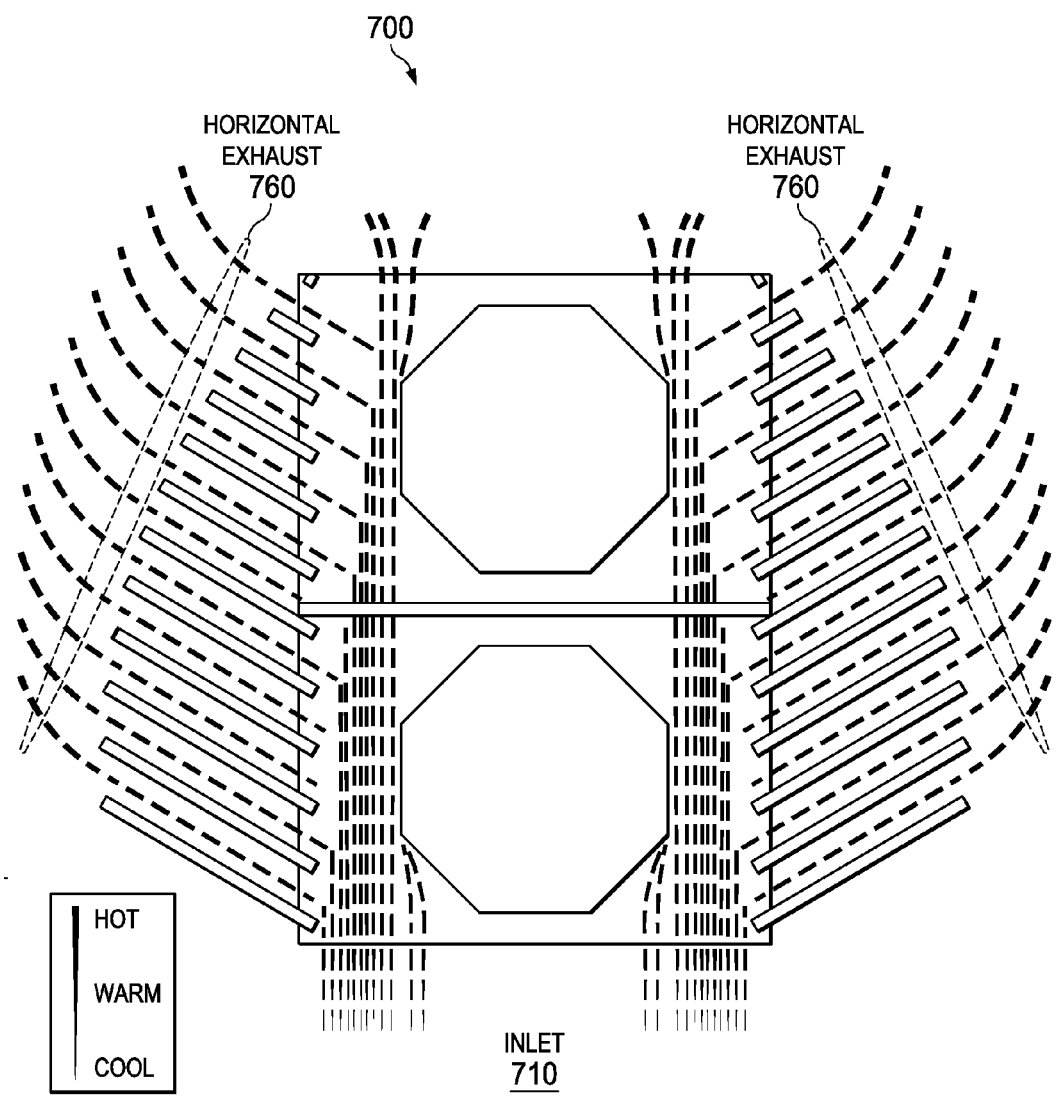

FIG. 6 illustrates an embodiment split-stream fin arrangement 600 comprising two sets of outwardly angled fins 625-626 separated by a central conduit 627. As shown the sets of outwardly angled fins 625-626 direct convection cooling air flow from the central channel (provided by the conduit 627) outwardly through horizontal exhausts of the embodiment split stream fin arrangement 600. Notably, low density cool air is drawn both from the bottom inlet 610, as well horizontally in an angle perpendicular to the direction of the conduit 627. FIGS. 7A-7B illustrate an embodiment RF module 700 that includes a split-stream fin arrangement similar to that depicted in FIG. 6. FIG. 7A illustrates a rear view of the embodiment RF module 700. As shown, the embodiment RF module 700 draws convection cooling air in through the inlet 710, which extends beneath the RF module 700, as well horizontally at least along the length of the central conduit. Notably, warm air is expelled through the horizontal exhausts 760. Because some convection cooling air is drawn in laterally (e.g., at least along the central conduit), RF modules located higher in a vertical array configuration are able to access fresh air. While this may not completely eliminate the cascading effect, it may serve to reduce inlet air temperatures of host devices located higher in the vertical array. FIG. 7B illustrates a front view of the embodiment RF module 700.

Figure 8:
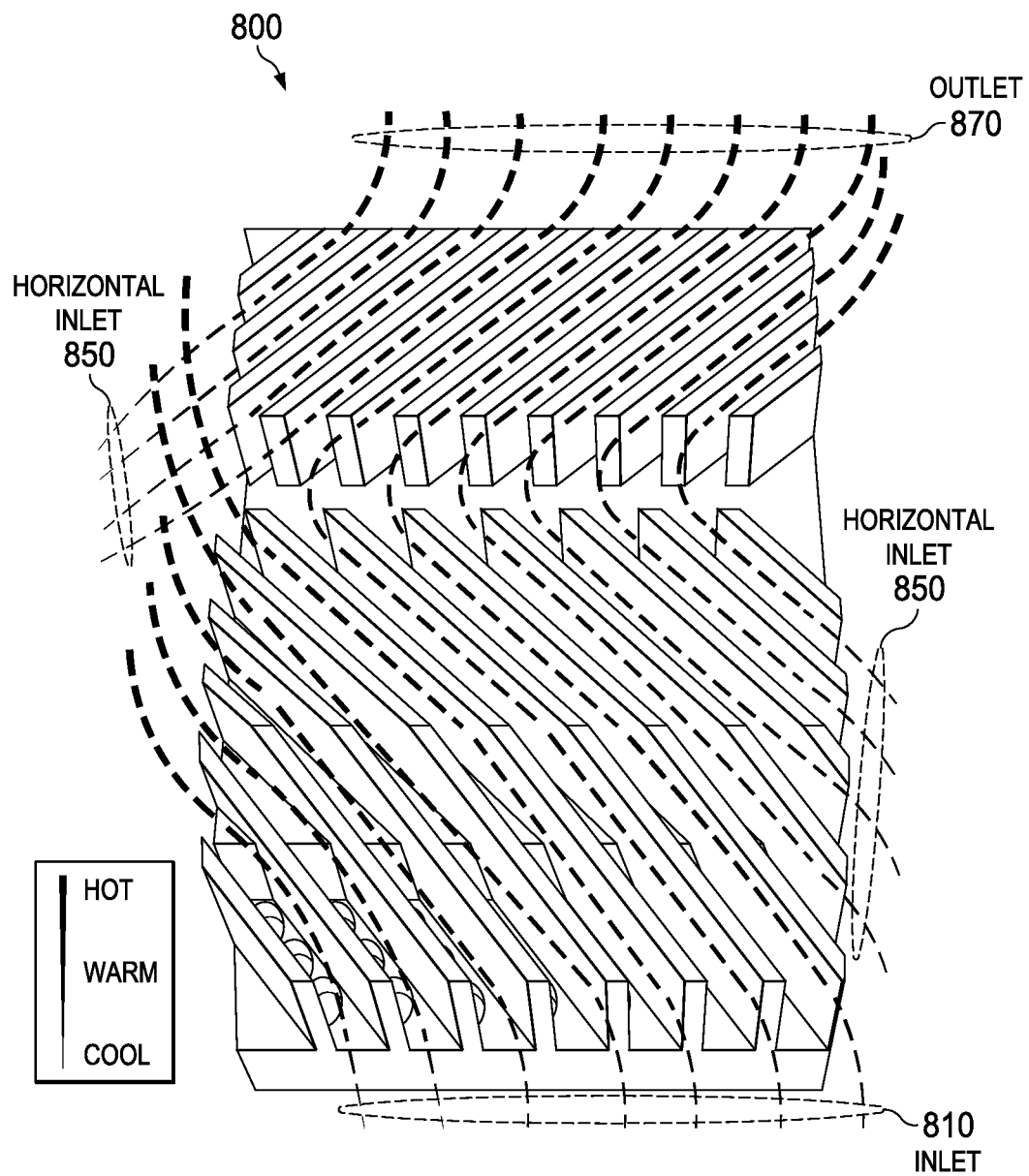
FIG. 8 illustrates a diagram of yet another embodiment heatsink design.
Figure 9A:
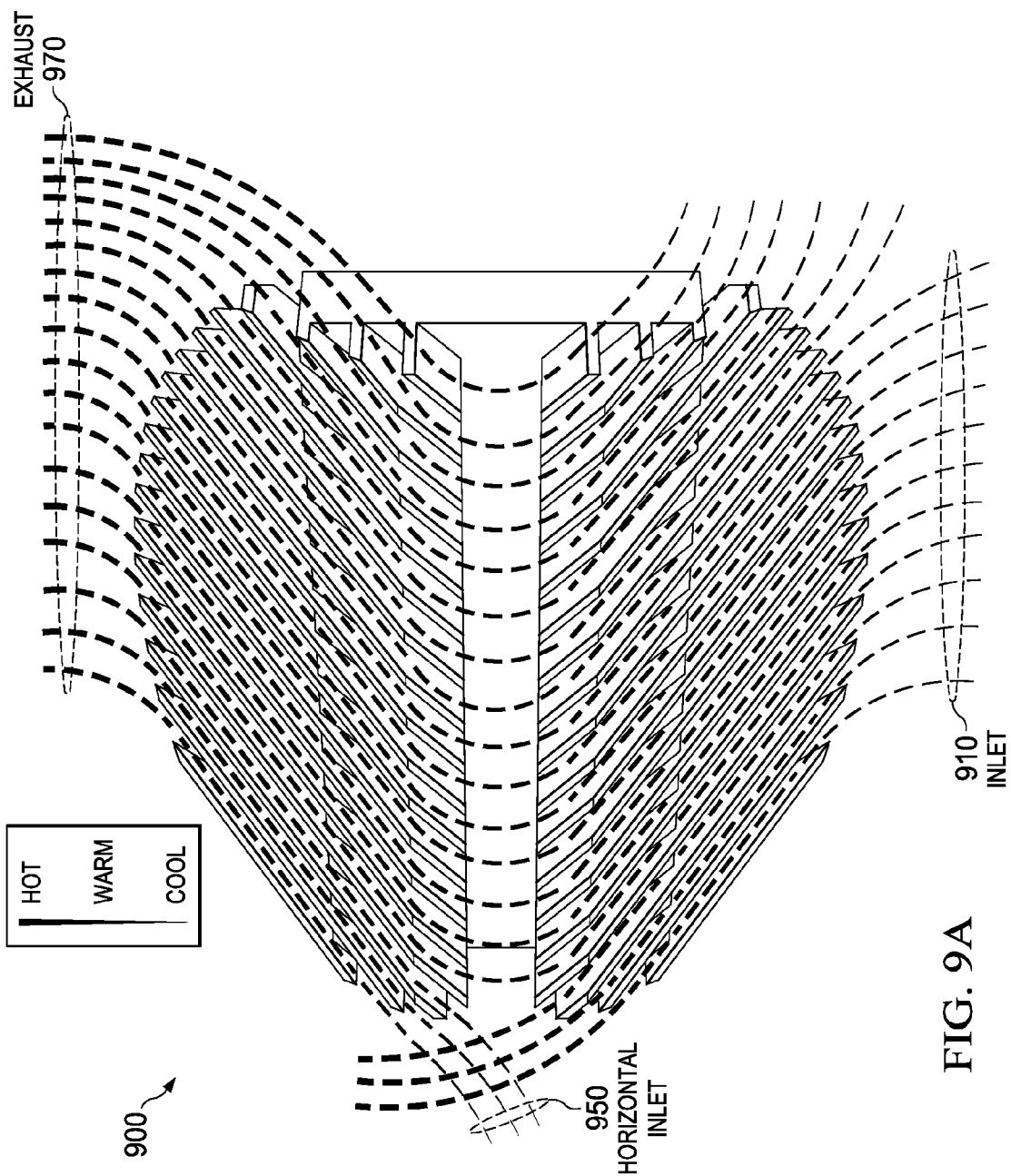
FIGS. 9A-9B illustrate diagrams of yet another embodiment RF module.
Figure 9B:
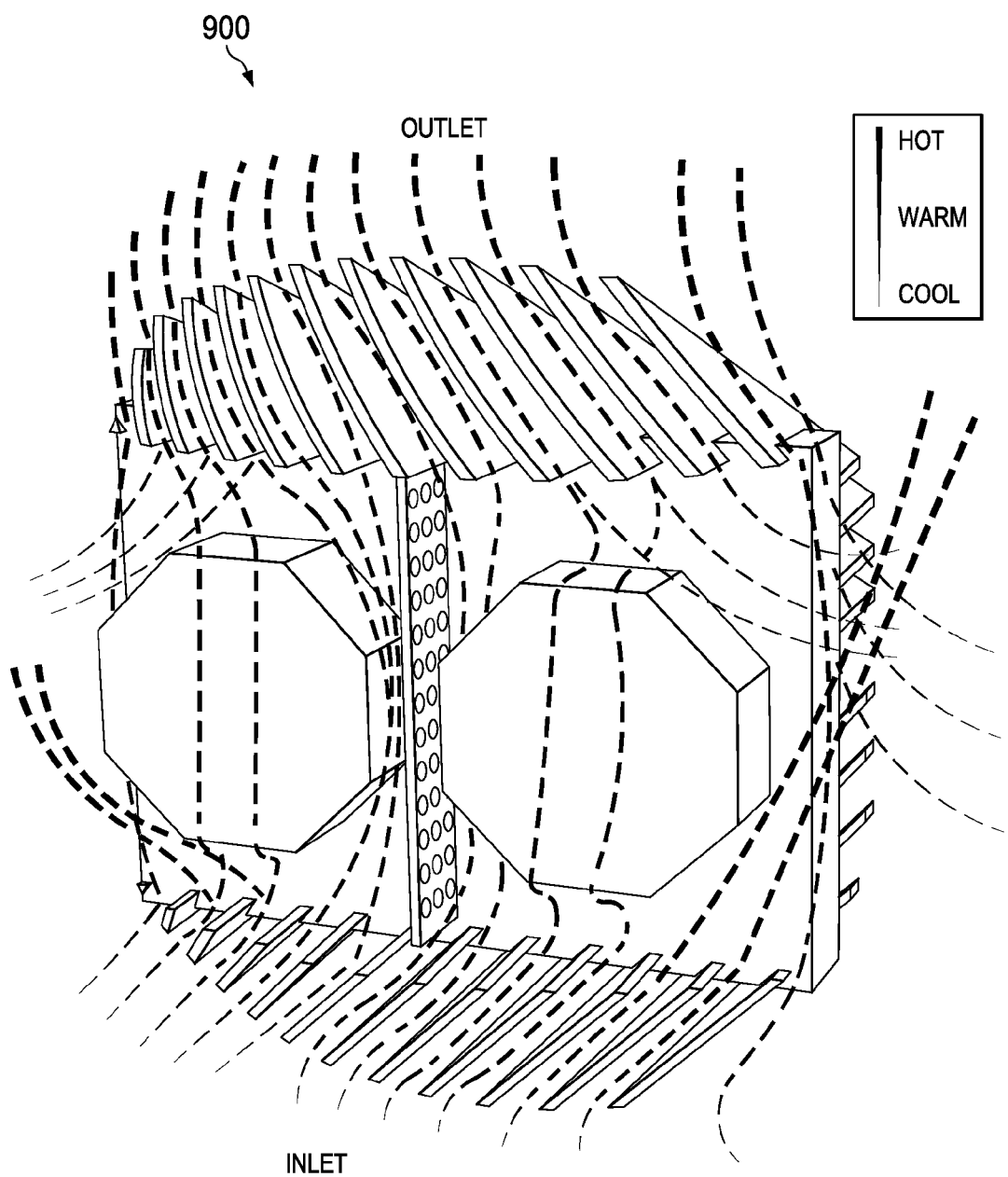

The split fin arrangements provided by this disclosure may also effectively dissipate heat when the angled fins are configured horizontally, as may occur when a host device is laid on its side. FIG. 8 illustrates a horizontally configured split fin arrangement 800. As shown, the horizontally configured split fin arrangement 800 draws convection cooling air from a lower inlet 810 as well as from horizontal inlets 850, and expels warm air out an exhaust 870. FIGS. 9A-9B illustrate an embodiment RF module 900 that includes a horizontally configured split-stream fin arrangement similar to that depicted in FIG. 8. FIG. 9A illustrates a rear view of the embodiment RF module 900. As shown, the embodiment RF module 900 draws convection cooling air in through a lower inlet 910 as well as through horizontal inlets 950, and expels warm air through an exhaust 970. FIG. 9B illustrates a front view of the embodiment RF module 900.

Figure 11:
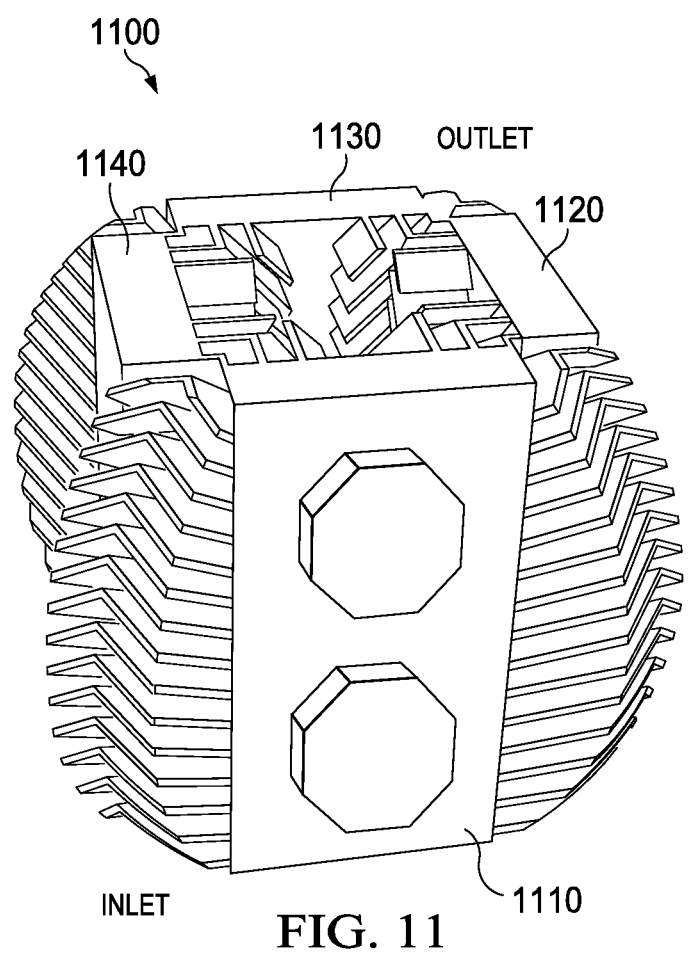
FIG. 11 illustrates a diagram of another embodiment multi-sector RF module cluster.

Embodiment split fin configurations of this disclosure may be particularly well-suited for a multi-sector configurations. FIG. 10A-C illustrates a multi-sector RF module cluster 1000 that includes a plurality of RF modules 1010, 1020, 1030, 1040 adjacently affixed to one another such that each of the RF modules 1010, 1020, 1030, 1040 provide wireless coverage to a different sector. As shown in FIG. 10A, the multi-sector RF module cluster 1000 is affixed to a backplane 1001, which may enable compact field installation. FIG. 10B illustrates a bird's-eye view of the multi-sector RF module cluster 1000, and FIG. 10C illustrates a bird's-eye view of the multi sector RF module-cluster 1000 with the plastic cover removed. FIG. 11 illustrates a multi-sector RF module cluster 1100 including four RF modules 1110, 1120, 1130, 1140 configured to provide wireless coverage in different sectors. The multi-sector RF module cluster 1100 may be similar to the multi-sector RF module cluster 1000 with the plastic covers completely removed.

Figure 12:
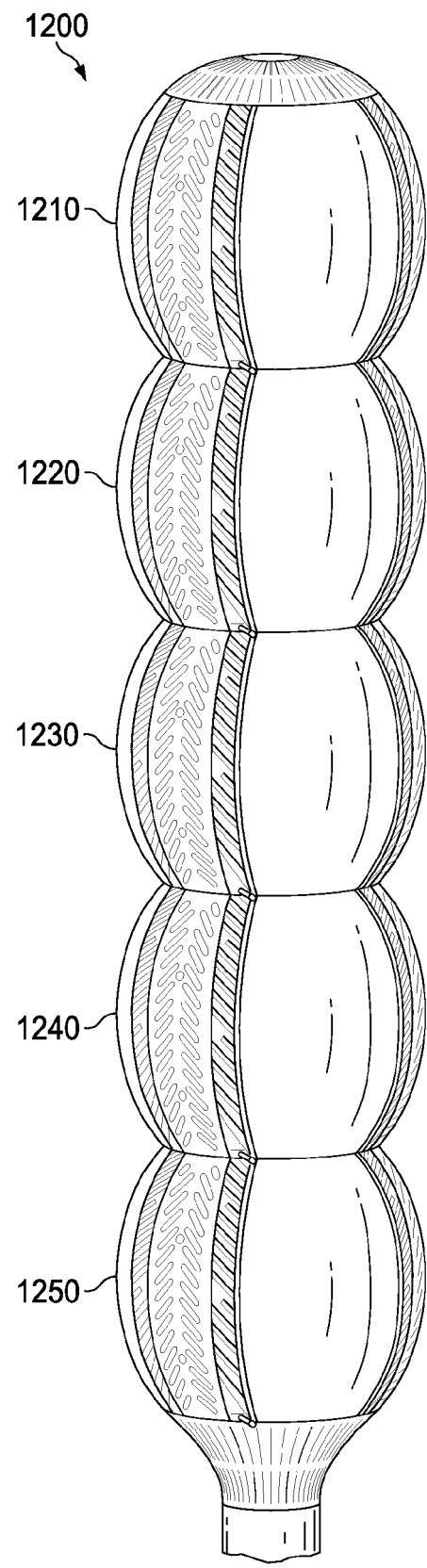
FIG. 12 illustrates a diagram of a modular AAS configuration.

Embodiment split fin configurations of this disclosure may also be well-suited for implementations in which host devices are arranged in a vertical array. FIG. 12 illustrates a modular AAS configuration 1200 comprising a vertical array of RF clusters 1210, 1220, 1230, 1240, 1250. Notably, the vertical array of RF clusters 1210, 1220, 1230, 1240, 1250 may be useful for achieving beamforming and other advanced antenna functionality.

Figure 14:
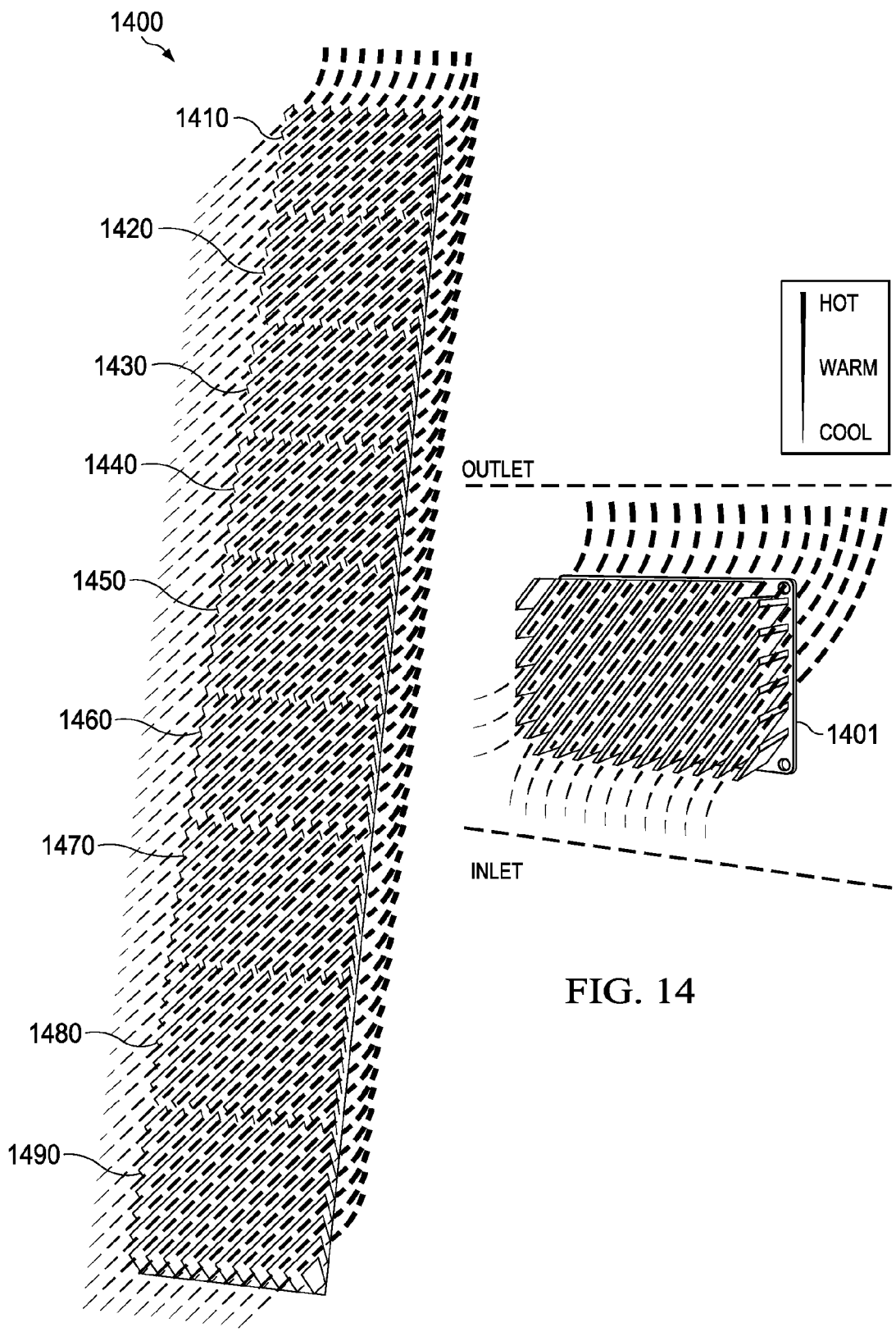
FIG. 14 illustrates a diagram depicting thermal dissipation in another vertically arrayed host device configuration.

Indeed, embodiment split fin configurations of this disclosure may outperform conventional parallel fin configurations in vertical array environments. FIG. 13 illustrates thermal dissipation in an arrayed antenna configuration 1300 comprising a plurality of RF modules 1310-1390, each of which implementing a straight/vertical fin configuration 1301. As shown, convection cooling air flows over the arrayed antenna configuration 1300 in a vertical manner such that air exhausted from lower RF modules feeds the inlet of upper RF modules. To with, the convection cooling air flows vertically from the bottommost RF module 1390 to the topmost RF module 1310, thereby causing comparatively warmer air to pass over RF modules positioned toward the top of the arrayed antenna configuration 1300. As a result, RF modules positioned higher in the arrayed antenna configuration 1300 may operate at a higher temperature, which may adversely affect the performance of the arrayed antenna configuration 1300. FIG. 14 illustrates thermal dissipation in an arrayed antenna configuration 1400 comprising a plurality of RF modules 1410-1490, each of which implementing an angled fin configuration 1401. As shown, convection cooling air flows over the arrayed antenna configuration 1400 in a similar manner as the arrayed antenna configuration 1300, and consequently RF modules positioned higher in the arrayed antenna configuration 1400 tend to exhibit higher operating temperatures.

Figure 15:
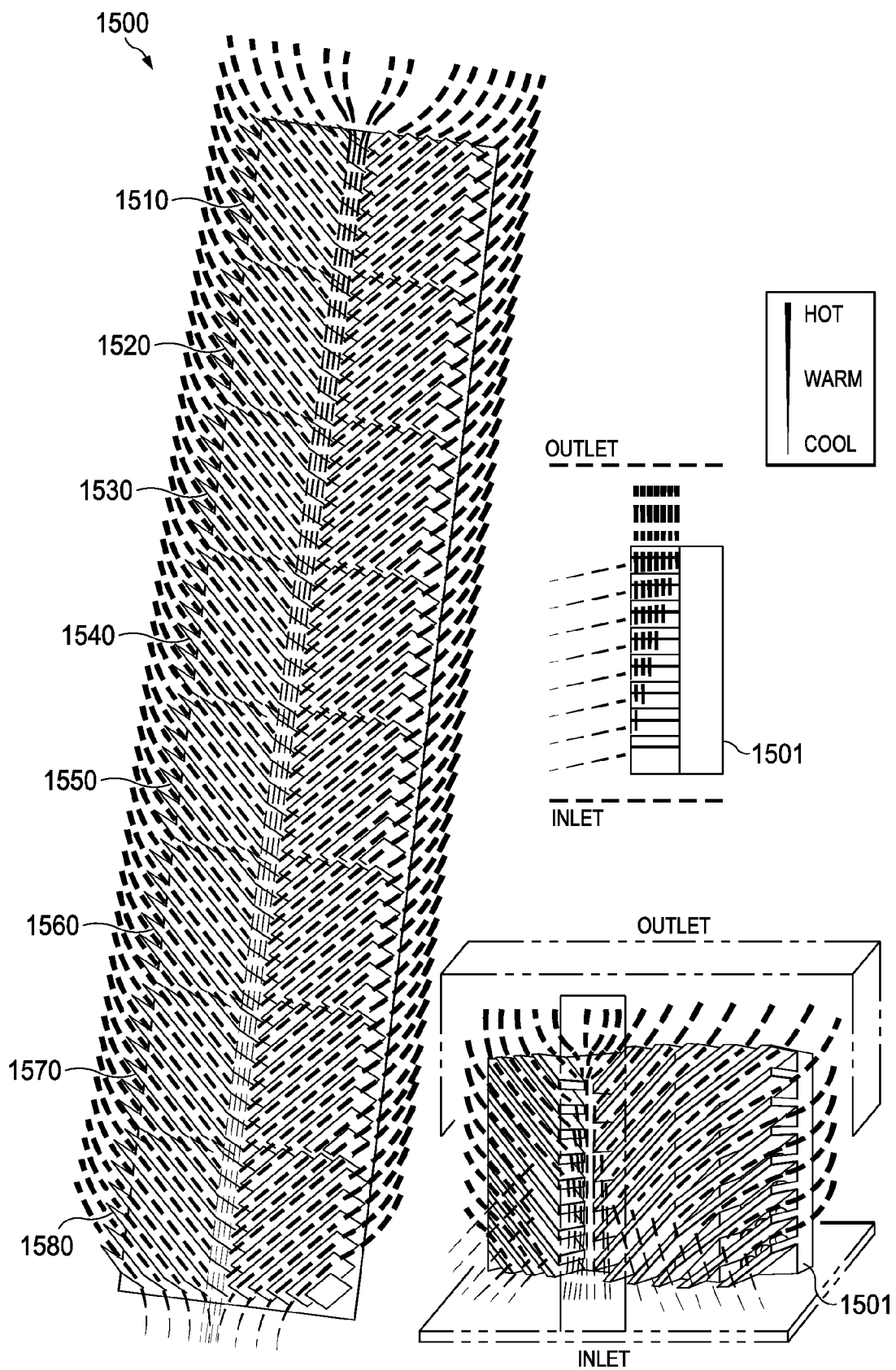
FIG. 15 illustrates a diagram depicting thermal dissipation in yet another vertically arrayed host device configuration.

Embodiment split fin configurations having inwardly angled fins draw low density cool air through horizontal inlets, thereby allowing cool air to access RF modules positioned higher in the array. FIG. 15 illustrates thermal dissipation in an arrayed antenna configuration 1500 comprising a plurality of RF modules 1510-1590, each of which having a split fin configuration 1501 that includes two pairs of inwardly angled fins separated by a central conduit. As shown, the split fin configuration 1501 allows cool air to be supplied to RF modules via the lower inlet as well as the horizontal inlet extending over the central conduit. This may allow upper RF modules to achieve comparatively lower operating temperature than would otherwise be attainable using the conventional straight/angled fin configurations 1301, 1401.

Dimensions of the embodiment split fin configurations may depend on various factors relating to, inter alia, the design of the host device. For instance, in an embodiment heat sink having an overall height of 180 mm, the fins may have a width of about 25 millimeters (mm), a length of about 120 mm, an inter-fin distance of about 8 mm, and a central channel/conduit width of 20 mm.

Embodiments of this disclosure provide split-stream heat sink fins for modular AASs. Embodiments of this disclosure provide a compact heat sink using a flow-diverting free convection fin configuration. In an embodiment, cooling air flow enters from one location, separates into multiple streams and exhausts from several other locations. Embodiments support multiple orientations. An embodiment compact AAS module has a natural convection heat sink that splits the cooling air stream without the use of flow separation baffles. In an embodiment, the flow enters from a single location, separates into multiple streams through natural convection-cooled fins, and exhausts from a maximized area.

An embodiment heat-sink is compact due to its ability to spread air flow over a maximized surface area of the active antenna module. As an example, the flow enters from the rear, separates into multiple streams, and exhausts out the front. An embodiment may be implemented in a confined space application.

An embodiment may be applied to a modular active antenna array system. When several modules are stacked vertically, the resulting flow pattern is such that cooling interference between modules is minimized, and desired fin cooling efficiency is substantially maintained.

An embodiment heatsink is flexible, such that the heat-sink may be rotated by 90 degrees from its vertical position to a horizontal position, while substantially maintaining the heat dissipation capabilities.

Embodiments of this disclosure provide a split-stream cooling flow pattern without using a baffle. The natural convection cooling air stream may enter from an inlet, be split by the heat sink fins, and exit from an outlet. The split air stream generally results in unequal inlet and outlet areas, providing a larger area for the exiting stream flow.

In embodiments, where multiple heat sinks are mounted together (e.g., in a clustered configuration), split-stream cooling flow patterns may provide cooling for a compact module arrangement. More specifically, cooling air streams may enter from the bottom of the RF cluster, be split by the heat-sink fins, and exit from both the top and sides of the RF cluster. Convection cooling flow exhaust may be expelled from the sides of the RF module cluster in order to generally minimize the thermal effect of stacking modules in an arrayed configuration.

An embodiment heat sink geometry provides natural convection flow sectorization. An embodiment provides a multiple entry-multiple exit, natural convection heat sink. An embodiment provides prolonged contact of cooling flow with the heat-sink through the fin configuration. An embodiment provides modularization of cooling flow to an individual AAS module, without using flow separation baffles. An embodiment heatsink can be rotated while largely maintaining heat sink efficiency.

An embodiment provides increased cooling efficiency for a compact modular Active Antenna System. The compact design helps reduce the Active Antenna System footprint. An embodiment provides a scalable natural convection cooling flow pattern that minimizes the cooling interference of stacked modules in an array configuration. An embodiment provides flexibility in array configuration. For example, the heat sink maintains its functionality when antenna modules are rotated to form a horizontal active antenna array.

The following references are related to subject matter of the present application. The following references are incorporated herein by reference as if reproduced in their entireties: (i) MacManus et al., U.S. Patent Application Publication No. 2011/0188205, published Aug. 4, 2011; and (ii) Huawei Remote Radio Unit RRU3201 and its associated documentation.

Embodiments of this disclosure provide a method of manufacturing a heat sink. The method includes forming a first set of fins along a heat dissipating face of a heat sink, forming a second set of fins along the heat dissipating face of the heat sink, and forming a central conduit along the heat dissipating face of the heat sink. The central conduit separates the first set of fins from the second set of fins. In an embodiment, the method of manufacturing further includes disposing a first set of channels between individual fins in the first set of fins, and disposing a second set of channels between individual fins in the second set of fins. The first set of channels and the second set of channels converge at the central conduit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A heat sink comprising:
a heat dissipating face;
a first set of fins extending across the heat dissipating face, wherein a first set of channels are formed between individual fins within the first set of fins;
a second set of fins extending across the heat dissipating face, wherein a second set of channels are formed between individual fins within the second set of fins, the second set of channels fins angled toward the first set of fins; and
a conduit receding into the heat dissipating face, the conduit separating the first set of fins from the second set of fins, wherein the conduit provides a pathway in which convection cooling air flows into, or out of, the first set of channels and the second set of channels.

2. The heat sink of claim 1, wherein the conduit prevents the first set of fins from intersecting with the second set of fins.

3. The heat sink of claim 1, wherein the first set of channels and the second set of channels converge at the conduit.

4. The heat sink of claim 3, wherein the conduit provides an outlet pathway to eject the convection cooling air from the first set of channels and from the second set of channels.

5. The heat sink of claim 3, wherein the conduit provides an inlet pathway to feed the convection cooling air into the first set of channels and into the second set of channels.

6. The heat sink of claim 1, wherein the heat sink is a passive heat sink.

7. The heat sink of claim 1, wherein the heat sink is an active heat sink.

8. A radio frequency (RF) module comprising:
active antenna components; and
a heat sink configured to dissipating heat generated by the active antenna components into the surrounding air, the heat sink comprising a heat dissipating face,
wherein the heat dissipating face comprises a first set of channels, a second set of channels angled toward the first set of channels, and a conduit receding into the heat dissipating face, the conduit separating the first set of channels from the second set of channels, wherein the conduit provides a pathway in which convection cooling air flows into, or out of, the first set of channels and the second set of channels.

9. The RF module of claim 8, wherein the first set of channels and the second set of channels converge at the conduit.

10. The RF module of claim 9, wherein the conduit provides an outlet pathway to eject the convection cooling air from the first set of channels and from the second set of channels.

11. The RF module of claim 9, wherein the conduit provides an inlet pathway to feed the convection cooling air into the first set of channels and into the second set of channels.

12. The RF module of claim 8, wherein heat sink is a passive heat sink.

13. A heat sink comprising:
a heat dissipating face; and
a split-stream fin arrangement disposed on the heat dissipating face, the split-stream fin arrangement including a central conduit receding into the heat dissipating face, a first set of channels, and a second set of channels, the first set of channels and the second set of channels converging at the central conduit, wherein the central conduit draws convection cooling air into, or out of, the first set of channels and the second set of channels.

14. The heat sink of claim 13, wherein the central conduit draws the convection cooling air vertically into the first set of channels and the second set of channels, at least some of the convection cooling air being expelled from the first set of channels and the second set of channels horizontally out of the sides of the heat dissipating face.

15. The heat sink of claim 13, wherein the convection cooling air is drawn inwardly through the first set of channels and the second set of channels, at least some of the convection cooling air being expelled out of the central conduit.

16. The heat sink of claim 13, wherein the split-stream fin arrangement further comprises a first set of fins and a second set of fins disposed on the heat dissipating face, the central conduit being positioned between the first set of fins and the second set of fins.

17. The heat sink of claim 16, wherein the first set of fins are angled toward the second set of fins.

18. The heat sink of claim 16, wherein the first set of channels are formed between individual fins in the first set of fins, and wherein the second set of channels are formed between the individual fins in the second set of fins.

19. The heat sink of claim 18, wherein the central conduit provides an inlet pathway to feed the convection cooling air into the first set of channels and into the second set of channels.

20. The heat sink of claim 18, wherein the central conduit provides an exhaust pathway to expel the convection cooling air flows out of the first set of channels and out of the second set of channels.

21. A method comprising:
generating heat by a host device; and
dissipating, by a heat sink affixed to the host device, the heat into the surrounding air, wherein the heat sink includes a heat dissipating face, a first set of channels extending across the heat dissipating face, a second set of channels extending across the heat dissipating face, and a central conduit receding into the heat dissipating face, the first set of channels and the second set of channel converging at the central conduit, wherein the central conduit draws convection cooling air into, or out of, the first set of channels and the second set of channels.

22. The method of claim 21, wherein dissipating heat generated by the host device into the surrounding air comprises:
drawing the convection cooling air through the central conduit and over the heat dissipating face.

23. The method of claim 21, wherein dissipating heat generated by the host device into the surrounding air comprises:
drawing the convection cooling air in horizontally from the sides of the heat dissipating face; and
expelling at least some of the convection cooling air flow through the central conduit and away from heat sink.

24. A heat sink comprising:
a heat dissipating face;
a first set of channels extending across the heat dissipating face;
a second set of channels extending across the heat dissipating face, the second set of channels angled toward the first set of channels; and
a conduit receding into the heat dissipating face, the first set of channels and the second set of channel converging at the central conduit, wherein the conduit provides a pathway in which convection cooling air flows into, or out of, the first set of channels and the second set of channels.

25. The heat sink of claim 24, wherein the conduit provides an outlet pathway to eject the convection cooling air from the first set of channels and from the second set of channels.

26. The heat sink of claim 24, wherein the conduit provides an inlet pathway to feed the convection cooling air into the first set of channels and into the second set of channels.

* * * * *